United States Patent
Doddrell et al.

[11] Patent Number: 5,166,616
[45] Date of Patent: Nov. 24, 1992

[54] METHOD FOR RECORDING SPIN RESONANCE SPECTRA

[75] Inventors: David M. Doddrell; Grahmam J. Galloway; Ian M. Brereton, all of Queensland, Australia

[73] Assignees: Univ of Queensland, St. Lucia, Australia; Bruker Analytische Messtechnik GmbH, Rhenstetten-Forcheim, Fed. Rep. of Germany

[21] Appl. No.: 654,651
[22] PCT Filed: Apr. 27, 1990
[86] PCT No.: PCT/DE90/00308
§ 371 Date: Feb. 12, 1991
§ 102(e) Date: Feb. 12, 1991
[87] PCT Pub. No.: WO90/13825
PCT Pub. Date: Nov. 15, 1990

[30] Foreign Application Priority Data
Apr. 29, 1989 [DE] Fed. Rep. of Germany ....... 3914302
May 31, 1989 [AU] Australia ................ PJ4467

[51] Int. Cl.$^5$ ............................. G01R 33/20
[52] U.S. Cl. ...................... 324/307; 324/300
[58] Field of Search ........... 324/300, 307, 308, 309, 324/310, 311, 312, 313, 314, 318, 322; 128/653 A, 653.3 C

[56] References Cited

U.S. PATENT DOCUMENTS

| | | | |
|---|---|---|---|
| 4,238,735 | 12/1980 | Muller | 324/310 |
| 4,680,546 | 7/1987 | Dumoulin | 324/307 |
| 4,703,270 | 10/1987 | Hall et al. | 324/309 |
| 4,972,147 | 11/1990 | Van Vaals | 324/307 |
| 5,081,417 | 1/1992 | Bovee et al. | 324/307 |

Primary Examiner—Michael J. Tokar

[57] ABSTRACT

A method serving for recording spin resonance spectra of test samples having at least two groups ($CH_3$, CH) of nuclei of the same kind and of substantially identical chemical shift, comprises the step of suppressing the signal of the second group (CH) for the purpose of obtaining an isolated image of the signal of the first group ($CH_3$). To this end, a pulse sequence of four r.f. pulses, preferably 90° r.f. pulses (10, 12, 13, 14), are irradiated upon the sample. The first r.f. pulse (10) is a soft pulse, selective for the nuclei of the first group ($CH_3$). The second r.f. pulse (12) is a soft pulse, selective for the nuclei of the second group (CH), and causes the magnetizations of the nuclei of the first group ($CH_3$) and of the second group (CH) to be transferred, at least in part, to a state of multiple-quantum coherence. Immediately following the second r.f. pulse (12) the third r.f. pulse (13), being at least one hard pulse, is irradiated upon the sample, and is adjusted in such a way that the multiple-quantum coherence is transferred to a correlated z-order state. A dephased magnetic gradient field pulse (15) is exerted upon the sample (30) in the interval $\tau_{HS}$ between the third r.f. pulse (13) and the fourth r.f. pulse (14). The fourth r.f. pulse (14) is a soft pulse, selective for the nuclei of the first group ($CH_3$). It is adjusted in such a way that the correlated z-order state is re-transferred to a state of single-quantum coherence of the nuclei of the second group (CH). Thereafter one detects the resonance signal of the nuclei of the first group ($CH_3$).

16 Claims, 5 Drawing Sheets

METHOD FOR RECORDING SPIN RESONANCE SPECTRA

FIELD OF THE INVENTION

The present invention relates to a method for recording spin resonance spectra of test samples having at least two groups of nuclei of the same kind and of substantially identical chemical shift, comprising the step of suppressing the signal of the second group for the purpose of obtaining an isolated image of the signal of the first group.

BACKGROUND OF THE INVENTION

It has been known in practice in the field of spin resonance spectroscopy to "edit" spectra where signals of different groups of nuclei heterodyne one with the other. By "editing" one understands different recording techniques which allow to filter out individual signals from the heterodyning spectra. Usually, this is effected by carrying out series of several measurements using different measuring parameters, and eliminating thereafter the undesirable signal contents by subtraction. Examples of such editing techniques for nuclear magnetic resonance applications have been described in the textbook entitled "Modern NMR Spectroscopy" by Sanders, Jeremy K. M. and Brian K. Hunter, Oxford University Press, 1987, pages 237 to 259. Other methods of this type are described by EP-OS 244 752 and EP-OS 166 559. In the case of these other known methods, uncoupled spins are suppressed by forming the difference between two measurements.

However, all of the techniques described above have the common disadvantage that for recording a single spectrum a plurality of measurements have to be performed successively in time, using different measuring parameters. While this presents no substantial problem to a laboratory in the case of durable chemical samples, considerable problems can result in cases where such nuclear magnetic resonance spectra are to be recorded on biological samples, i.e. on living tissue. This is true above all for in-vivo measurements to be carried out on patients where movement artefacts may lead to adulterations of the measured values.

In addition, subtracting measuring methods are connected with the fundamental drawback that the subtraction of high noise signal amplitudes may give rise to measuring errors which may be in the same range of magnitude as the useful signal.

According to other known methods, nuclear magnetic resonance spectra are recorded in a volume-selective way, i.e. only for a limited, geometrically defined area of a sample. This recording technique has gained particular importance in the fields of biological research and medicine. For, this recording technique enables, for example, a nuclear magnetic resonance spectrum to be recorded for a given, defined point in an inner organ of a patient. The technique of recording volume-selective nuclear magnetic resonance spectra has been known as such. Examples of this technique are found in the textbook entitled "Biomedical Magnetic Resonance Imaging" by Wehrli, Felix W., Derek Shaw and J. Bruce Kneeland, Verlag Chemie, 1988, pages 1 to 45 and 521 to 545.

Other known methods are, for example, the so-called SPARS method, which has been described by the U.S. publication "Journal of Magnetic Resonance", 67 (1986), page 148, and the so-called DIGGER method, described by the U.S. publication "Journal of Magnetic Resonance", 68 (1986), page 367. These known methods are volume-selective methods where the layers outside the selective volume area are saturated to leave only the selected volume area. However, it is the disadvantage of these two known methods, in particular of the DIGGER method, that they require a high r.f. power and that the pre-saturation r.f. pulses must be tuned very exactly in both methods as otherwise additional signals may be generated.

Another special method for volume-selective imaging of nuclear magnetic resonance spectra using three 90° r.f. pulses spaced in time, while applying simultaneously different magnetic gradient field pulses in different coordinate directions, has been described for example by DE-OS 34 45 689. In the case of this known method, conventional stimulated spin echoes are produced.

Finally, it has been known from the U.S. publication "Magnetic Resonance in Medicine", 9 (1989), pages 254 to 260 to edit volume-selective spectra by means of homonuclear polarization transfer, using a single transfer. Now, when the nuclear magnetic resonance spectrum of a homonuclear or heteronuclear coupled spin system of the general form $A_n X_m$ is to be recorded—this is of great interest in biomedical research as such measurements permit to draw conclusions regarding the metabolism in organic tissue—one frequently encounters the problem of overlapping signals. In the case of a homonuclear coupled spin system, both coupling partners consist of one and the same kind of nuclei, for example of protons ($^1H$), while in the case of heteronuclear coupled spin systems the coupling partners belong to different kinds of nuclei, for example the A group may be protons ($^1H$) while the X group may be a carbon isotope ($^{13}C$). If one regards lactate, a $A_3X$ system, as a homonuclear example, the methyl group ($CH_3$), has substantially the same chemical shift, i.e. line position in the spectrum, as the $CH_2$ group of lipid, both chemical shifts being in the range of 1.35 ppm. Given the fact, however, that the lipid concentration may be considerably higher in living tissue, the $CH_2$ signal of the lipid will mask the $CH_3$ signal of the lactate. The same applies by analogy to any editing of the reonuclear $A_n X_m$ systems, for example for an $A_3X$ system such as methanol with a $^{13}C$ enrichment.

Now, if in the case of the first mentioned example a volume-selective lactate measurement were carried out in a lipid environment, using the known editing techniques, where, as has been mentioned before, two measurements have to be performed successively in time using different parameters, problems would be encountered if the patient should move during the two measurements. For, any such movement would give rise to artefacts, which would influence the measurements differently so that it would be necessary, during the subsequent substracting process, to work out, by suitable editing, not only the desired isolated $CH_3$ signals of the lactate, but also the undesired lipid artefacts.

Although the invention will be explained for the purposes of the present invention by way of an application chosen from the nuclear magnetic resonance (NMR) field, it is understood that it can be applied also in connection with other forms of spin resonance, in particular electron paramagnetic resonance (EPR) or nuclear/electron double resonance techniques (ENDOR, ELDOR, NEDOR, Overhauser, etc.).

Further, although the invention will be described using the simple example of scalar coupling (J) it is understood that it is suited also for application in connection with other coupling types, for example, dipole coupling.

It has further been known, in selective editing of metabolite signals, to make use of multiple-quantum transitions (MQ) or zero-quantum transitions (ZQ). Examples of this method are found in the U.S. publication "Journal of Magnetic Resonance", 64 (1985), page 38, in U.S. publication "Journal of Magnetic Resonance", 78 (1988), page 355, in U.S. publication "Journal of Magnetic Resonance", 77 (1988), page 382, and in U.S. publication "Magnetic Resonance in Medicine", 9 (1989), page 32.

The essential drawback of all subtracting methods lies in their dependence on the precision of the subtraction process. This is a critical factor in all in-vivo measurements where dominating resonances of water and lipid may be encountered. Another drawback lies in the fact that two-dimensional measurements must be performed in order to extract the metabolite signal. A known one-dimensional method made use of selective excitation and pulsed field gradients for selecting exclusively zero-quantum coherences so that it was possible, with a single measurement, to obtain satisfactory spectral editing and to suppress solvents. However, these methods are connected with the essential drawback that losses in the signal-to-noise ratio are encountered. This is so, because in any case zero-quantum and multiple-quantum coherences will always be excited jointly, but only one of these coherences will be converted to an observable single-quantum signal (SQ) while the other will be dephased by a field gradient or eliminated by phase shifting. If zero-quantum coherences are selected, only one fourth at the maximum of the coherence will be available for subsequent application of field gradients, and the effectivity of the formation of multiple-quantum coherences, if desired, may depend on a plurality of spin-spin couplings, as for example in the case of ethanol where single-quantum and triple-quantum contents (SQ, TQ) get lost. It has also been proposed to make use of selective polarization transfer methods, but these, too, lead to signal losses as a result of the transfer direction, or as a result of the dependence of the polarization transfer on the r.f. pulse angle, so that extensive cyclical phase shifting is required. For more details regarding the last-mentioned effects, reference is made to the U.S. publication "Journal of Magnetic Resonance", 66 (1986), page 86, and to the U.S. publication "Progress in NMR Spectroscopy", 16 (1983), page 163.

U.S. Pat. No. 4,521,732 describes a further method where a series of successive r.f. pulses is directed upon a sample comprising at least two different types of nuclie, wherein the first and the third pulses act selectively on the one kind of nuclei while the second pulse acts selectively on the other kind of nuclei, and wherein the time interval between each pair of successive pulses is such as to permit the development of a heteronuclear scalar coupling interaction.

Finally, still other pulse sequences used for examining heteronuclear systems have been known from U.S. Pat. No. 4,680,546, U.S. Pat. No. 4,238,735 and U.S. Pat. No. 4,703,270.

SUMMARY OF THE INVENTION

Now, the present invention has for its object to improve a method of the before-mentioned type in such a way that any desired spectral contents can be edited by a single measurement, without loss in signal amplitude.

This object is achieved according to the invention by a method wherein a pulse sequence of four r.f. pulses, preferably 90° r.f. pulses, are irradiated upon the sample, the first r.f. pulse is a soft pulse, selective for the nuclei of the first group, the second r.f. pulse is a soft pulse, selective for the nuclei of the second group, and adjusted in such a way that the magnetizations of the nuclei of the first group and of the second group are transferred, at least in part, to a state of multiple-quantum coherence, immediately following the second r.f. pulse the third r.f. pulse, being at least one hard pulse, is irradiated upon the sample, and adjusted in such a way that the multiple-quantum coherence is transferred to a correlated z-order state, a dephased magnetic gradient field pulse is exerted upon the sample in the interval between the third r.f. pulse and the fourth r.f. pulse, and the fourth r.f. pulse is a soft pulse, selective for the nuclei of the first group, and is adjusted in such a way that the multiple-quantum coherence is retransferred to a state of single-quantum coherence of the nuclei of the first group, and thereafter one detects the resonance signal of the nuclei of the first group.

The object underlying the present invention is further solved by the following features:

a pulse sequence of four r.f. pulses, preferably 90° r.f. pulses, are irradiated upon the sample, the first r.f. pulse is a soft pulse, selective for the nuclei of the first group, the second r.f. pulse is a soft pulse, selective for the nuclei of the second group, and adjusted in such a way that the magnetizations of the nuclei of the first group and of the second group are transferred, at least in part, to a state of multiple-quantum coherence, immediately following the second r.f. pulse the third r.f. pulse, being at least one hard pulse, is irradiated upon the sample, and adjusted in such a way that the multiple-quantum coherence is transferred to a correlated z-order state, a dephased magnetic gradient field pulse is exerted upon the sample in the interval between the third r.f. pulse and the fourth r.f. pulse, and the fourth r.f. pulse is a soft pulse, selective for the nuclei of the first group, and is adjusted in such a way that the correlated z-order state is retransferred by polarization transfer from the nuclei of the first group to a state of single-quantum coherence of the nuclei of the second group, and thereafter one detects the resonance signal of the nuclei of the first group.

The method according to the invention makes use of the so-called ECZOTIC pulse sequence (Editing via Correlated Z-order with Total Inherent Coherence), where all metabolite coherences are transferred selectively to a correlated z-order or a longitudinal two-spin order, similar to known methods that have become known under the catchword INEPT; compare for example U.S. publication "Progress in NMR Spectroscopy", 16 (1983), page 163.

In this connection "Z-order" means that the magnetizations are aligned in the z-direction (field direction) in a correlated way before a magnetic field gradient is applied so that they will not dephase in these gradients, in contrast to the remaining, disturbing coherences.

Consequently, the transfer process is followed by dephasing of the other signals, using pulsed field gradients, so that the before-mentioned orders are transferred to observable single-quantum coherences, with maximum signal yield. The insensitivity of z-quantum coherences to existing field inhomogeneities has been known before, and has also been used as basis for editing methods; however, the correlated z-order, just as any other longitudinal magnetization, is likewise invariant in the presence of a field gradient and provides, consequently, an alternative approach for a spectral editing method. Although, generally, the method according to the invention can be applied to any spin multiplet, it will be described in detail, for the purposes of the present patent application, by way of the spectral editing of lactate and ethanol.

According to one particularly preferred embodiment of the method according to the invention, the sample is a lactate sample or an ethanol sample.

This application is one of particular importance in biomedicine.

A particularly preferred solution is obtained when the first and the third r.f. pulse are in x phase and the second and the third r.f. pulses are in y phase.

According to another particularly preferred embodiment of the invention, for volume-selective imaging, the sample is exposed in a conventional manner to a sequence of magnetic gradient field pulses of different coordinate directions, and at least one r.f. pulse is adjusted in a disc-selective manner.

Further, a 180° pulse is, preferably, irradiated upon the sample, at the middle of the time interval between the first and the second r.f. pulses. This feature provides the advantage that the evolution of the spins is refocused in consequence of a deviation of the chemical shift.

Advantageously, a second 180° r.f. pulse is irradiated upon the sample following the fourth r.f. pulse, preferably at the end of a time interval of $\frac{1}{4}$ J.

This feature provides the advantage that the evolution of the spins is likewise refocused in the time interval between the fourth r.f. pulse and the detection of the signal.

According to a further preferred variant of the method according to the invention, the time interval between the first r.f. pulse and the second r.f. pulse is selected to be equal to an odd multiple of the reciprocal value of twice the coupling constant between the first group and the second group.

Finally, a particularly good effect is achieved if, for imaging purposes, volume-selective measurements are carried out, in the manner known as such, on a plurality of areas of the sample.

Other advantages of the invention will appear from the specification and the attached drawing.

It is understood that the features that have been described before and will be explained hereafter may be used not only in the described combinations, but also in any other combination, or individually, without leaving the scope and intent of the present invention.

BRIEF DESCRIPTION OF THE APPLICATION DRAWINGS

One embodiment of the invention will now be described in more detail with reference to the drawings in which.

DETAILED DESCRIPTION OF THE PREFERRED EMBODIMENTS

Generally speaking, it is one of the objectives of the present invention to manipulate a spin system of $X_nY_m$, wherein X and Y are proton spins with scalar coupling. Within one intense-field approximation, the initial spin coherences can be described by a product operator as follows $$U^n S_z V^{m-1} \text{ (for } Y_m\text{)}$$

and

$$U^{n-1} I_z V^m \text{ (for } X_n\text{)}.$$

U and V are unit operators, as described, for example, in U.S. publication "Journal of Magnetic Resonance", 55 (1983), page 128. Assuming that $m \geq n$, the following coherence is obtained which is of interest here for reasons of the signal-to-noise ratio:

$$U^n S_z V^{m-1}.$$

Figure 1:
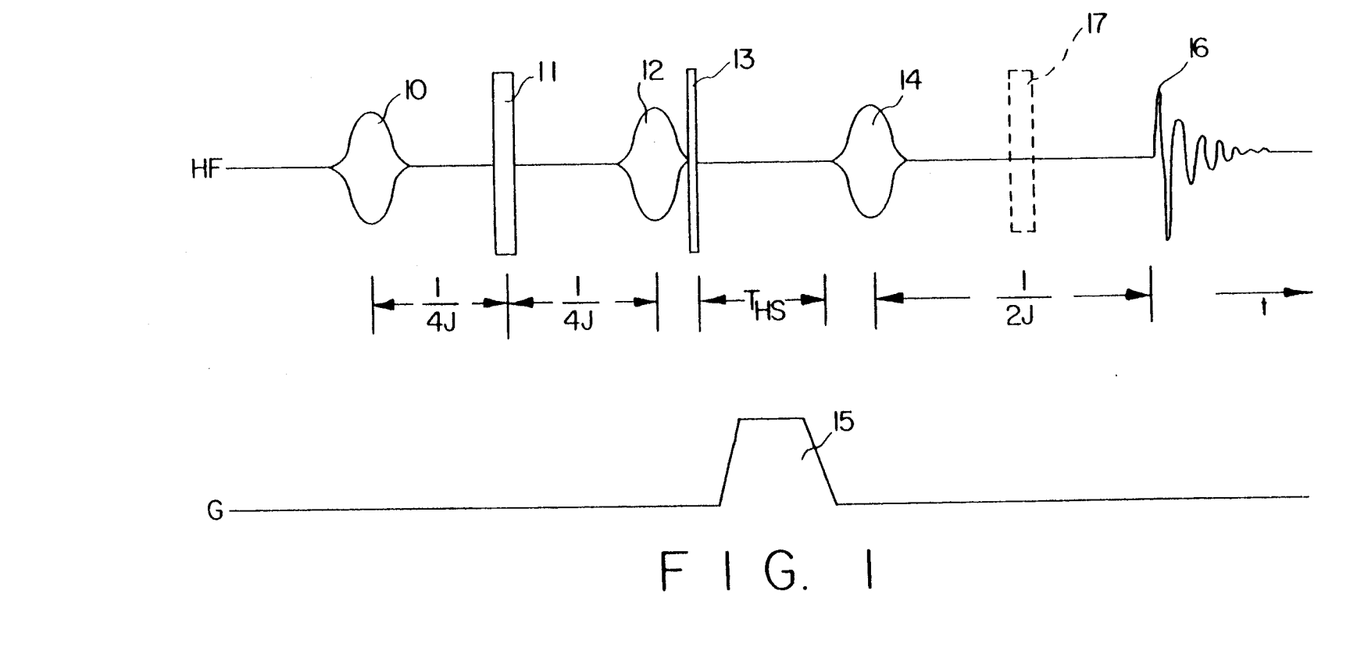
FIG. 1 shows a diagram illustrating a pulse sequence of the kind used in connection with the method according to the invention.

FIG. 1 shows a so-called ECZOTIC pulse sequence. The following reflections will be based on the assumption of a spin system where n=1, as encountered for example in lactate. The evolution periods of $\frac{1}{4}$J and $\frac{1}{2}$J plotted in FIG. 1 have been measured in each case from the center of the selective pulse of low power, which is illustrated by a Gaussian form. The time $\tau_{HS}$ indicated in FIG. 1 for the pulsed homospoil gradient is 120 ms, and 50 ms have been allowed for adjustment of the magnet. For n=1, i=y, and for n=2, i=x.

A first 90° pulse 10 is irradiated selectively at the resonance frequency s of the CH₃, in order to maximize the suppression of water that will occur subsequently. The variations in spin coherence resulting therefrom after the evolution period ½J are the following:

Wherein $\pi/2$ ($\omega_s$, x) is a selective "soft" r.f. pulse 10 with a +x phase, the mean frequency of which coincides with the resonance frequency $\omega_S$. It is sufficient if narrow-band pulses of a Gaussian form are used.

At the end of the period t of ¼J, a 180° r.f. pulse 11 is then irradiated, this pulse being a "hard" r.f. pulse and serving to refocus the evolution, due to a deviation of the chemical shift. The 180° r.f. pulse 10 may also be adjusted in a disk-selective way, but may not be selective with respect to the chemical shift.

Following another time interval of ¼J, a second selective 90° r.f. pulse 12 is introduced. The second selective 90° r.f. pulse 12 is in +y phase and is irradiated selectively upon the resonance frequency $\omega_I$ of the lactate CH. The second 90° r.f. pulse 12 produces a multiple-quantum coherence which is then transferred immediately to a correlated z order, by a "hard" 90° r.f. pulse 13 suitably adjusted in phase and following immediately the second "soft" 90° r.f. pulse 12. This "hard" 90° r.f. pulse 13 may also be adjusted to be disk-selective. One then obtains:

At the particular point in time, all the other spins, including those of the water, have received only the "hard" 90° r.f. pulse 13 which produces a single-quantum coherence. If the sample is now exposed to pulsed magnetic field gradients 15, this will lead to dephasing of this transversal coherence, while the correlated z order of the CH₃ group of the lactate, $I_zS_zV^{m-1}$, remains uninfluenced. In this connection, it has been proposed by U.S. publication "Journal of Magnetic Resonance", 80 (1988), page 168, to produce a correlated z-order, but this proposed process is different insofar as the publication describes an experiment with correlation of the electron population transfer utilizing the off-resonance phase shift characteristics of semi-Gaussian pulses.

The pulse sequence of FIG. 1 may now be developed under different aspects, in order to translate the correlated z-order to an observable signal.

According to a first variant of the pulse program, a selective 90° r.f. pulse 14 is introduced, whose center frequency is identical to the resonance frequency $\omega_s$ and produces a single-quantum coherence for the CH₃ spins in a J-order state which is refocused in a simple way by letting an additional period of ½J pass before a signal 16 is recorded:

It should be noted in this connection that the final signal corresponds to the spin coherence of the CH₃ group altogether available.

According to another variant of the pulse sequence according to FIG. 1, the pulse 14 is introduced at the end, as a selective read pulse having the frequency $\omega_I$, which produces a single-quantum coherence for the CH spins by polarization transfer from the CH₃ group, although in this case certain phase and intensity distortions are encountered:

In addition, it is also possible to have the forth r.f. pulse 14 followed, at a time interval of ¼J, by another 180° r.f. pulse 17 which is likewise adjusted to be "hard" or disk selective. This pulse 17 then refocuses the evolution of the spins, due to a deviation of the chemical shift. FIG. 2 shows by comparison the effects of an ECZOTIC pulse sequence according to FIG. 1, on the one hand, and spectrum editing with zero-quantum transfer on the other hand, for lactate. It can be predicted that the signal generated by zero-quantum coherence selection will be smaller by a factor 4 than the signal generated with the aid of an ECZOTIC pulse sequence according to FIG. 1, due to the effect which the pulsed magnetic field gradient has on a multiple-quantum coherence, as mentioned before, and to the formation of a mixture of zero-quantum components with x and y phase of which only one can be transferred at any time to single-quantum coherence.

Figures 2A, 2B:
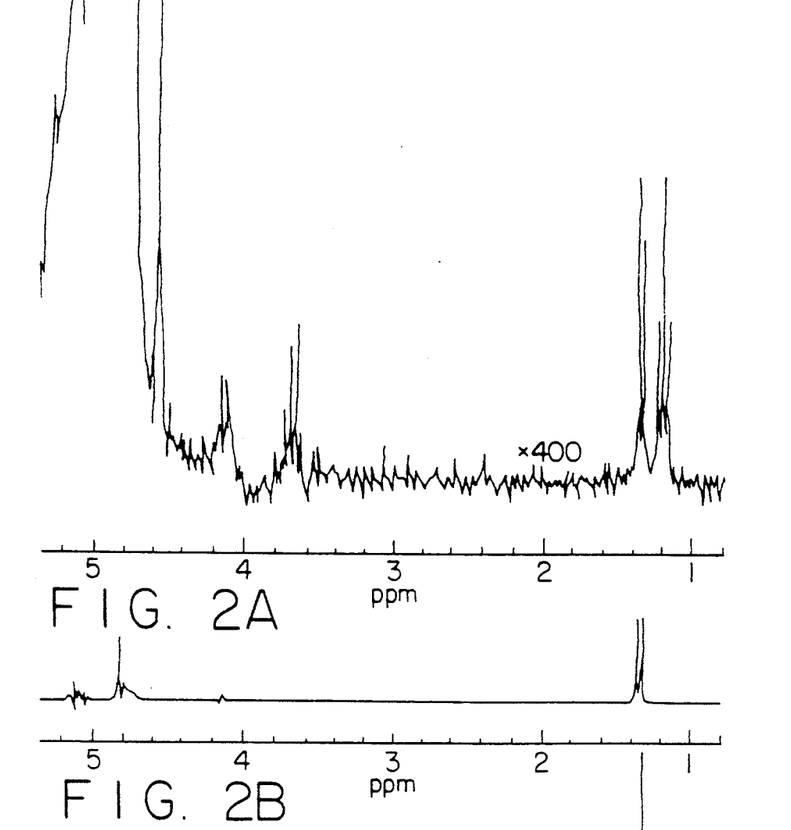
FIG. 2A shows a 200 MHz proton spectrum of 100 mM of lithium lactate and ethanol in 10% $D_2O/H_2O$, measured with the aid of a 90° pulse, and recorded by the FID imaging technique.
FIG. 2B shows the spectrum of FIG. 2A, including editing of the lactate-$CH_3$ using zero-quantum coherence filtering.
Figure 2C:
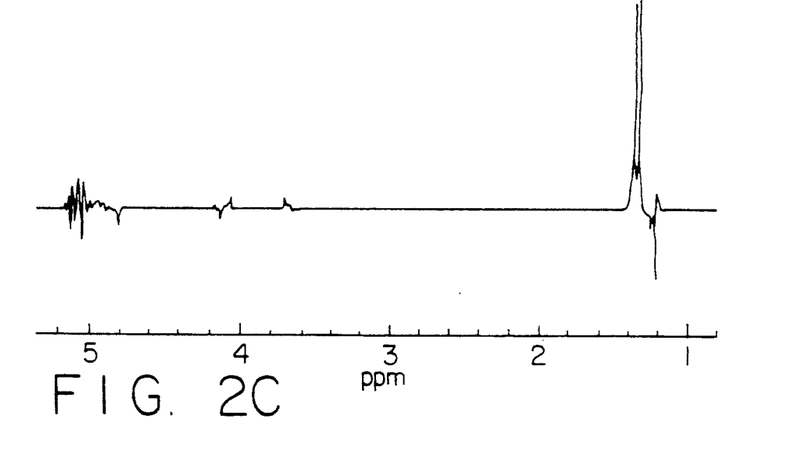
FIG. 2C shows the spectrum of FIG. 2A, but using an ECZOTIC pulse sequence according to FIG. 1, with the frequencies and pulse lengths set for the editing of lactate.

The measurement represented in FIG. 2 was recorded at a proton frequency of 200 MHz on a sample of 100 mM lithium lactate and ethanol in 10% D₂O/H₂O. FIG. 2A shows a usual spectrum obtained from a single signal, using a normal 90° r.f. pulse with x phase. By comparison, FIG. 2B shows a spectrum where the lactate-CH₃ has been edited by zero-quantum coherence filtering, and FIG. 2C shows a corresponding spectrum obtained with the aid of the pulse sequence according to FIG. 1, with the frequencies and pulse lengths suitably set for editing of the lactate.

It will be readily seen from these measurements that the signal-to-noise ratio of the measurement carried out in accordance with the invention, as illustrated in FIG. 2C, is approximately three times greater than the signal obtainable by zero-quantum editing. The excellent suppression of the water signal by a factor of at least 4000:1 enables the signal receiver to be operated with a high amplification factor in order to obtain an optimum signal-to-noise ratio.

Now, if the ECZOTIC pulse sequence according to FIG. 1 is applied to a spin system where n=2, for example to ethanol, the following consideration applies: The 90° phase shift of the second 90° r.f. pulse 12 for producing a multiple-quantum coherence at $\omega_I$ and of the following "hard" 90° r.f. pulse 13 is not required because of the evolution of the S spins of the CH₃ group coupled to the two I spins. One then arrives at the following relationships:

-continued $$+mU^2S_zV^{m-1}$$

In this case, too, the correlated z-order can be translated to an observable single-quantum magnetization for the $CH_3$ spins, with maximum signal yield, or for the $CH_2$ spins by polarization transfer, depending on the frequency of the last selective pulse. In the first-mentioned case, maximum suppression of the water can be ensured by the selectivity of the Gaussian read pulse with the frequency $\omega_S$.

The difference in signal-to-noise ratio between the ECZOTIC method and the zero-quantum filtering method can be predicted to be equal to the factor 8. Consequently, an additional factor of 2 is lost during the step of producing the multiple-quantum coherence, when $n=2$, in addition to the factor 4 mentioned before for the case where $n=1$. This is so because both single-quantum and three-quantum components are produced and will get lost later during the time when spoil gradients become active.

Figure 3A:
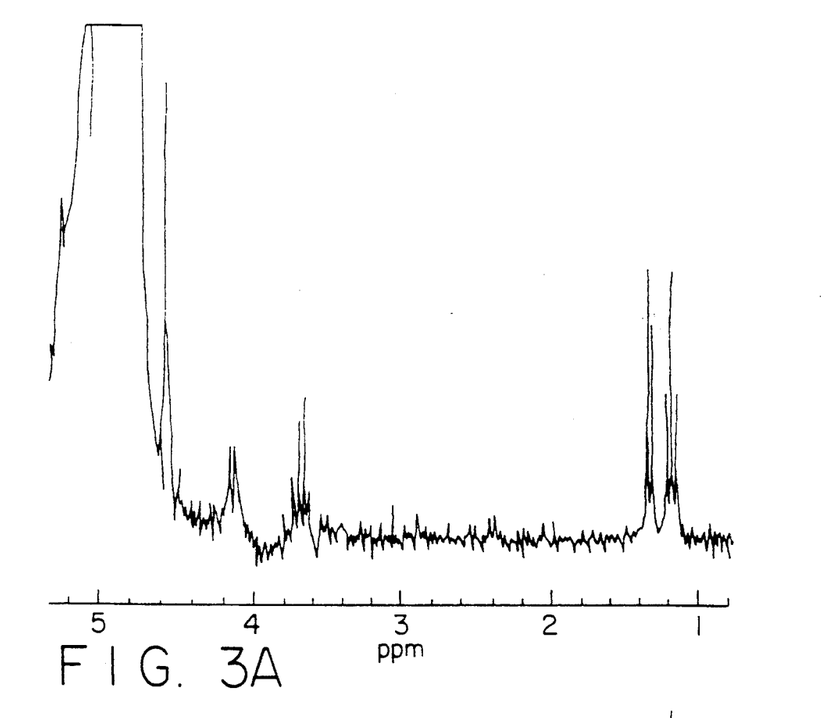
FIG. 3A shows again, for comparative purposes, a spectrum as that shown in FIG. 2A.
Figure 3B:
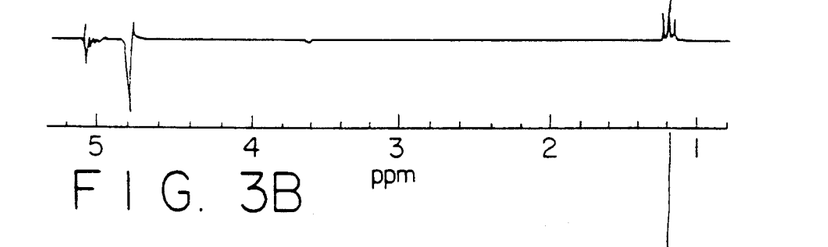
FIG. 3B shows the spectrum of FIG. 2A, but with the ethanol-$CH_3$ being edited using zero-quantum coherence filtering.
Figure 3C:
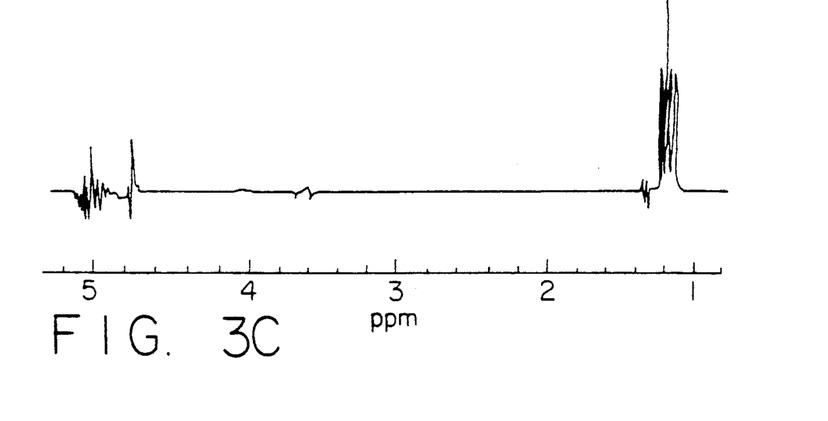
FIG. 3C shows the spectrum of FIG. 2A which was obtained, however, using an ECZOTIC pulse sequence according to FIG. 1, with the frequencies and pulse lengths set for the editing of ethanol.

A comparison between the two methods, as employed for the editing of ethanol, is illustrated in FIG. 3 where FIG. 3A shows a normal spectrum recorded on a sample, as in the case of the measurement of FIG. 2A, while FIG. 2B shows an edited ethanol-$CH_3$ spectrum obtained with the aid of zero-quantum coherence filtering, and FIG. 3C finally illustrates the application of the ECZOTIC pulse sequence, with excitation of ethanol. It will be readily seen that the signal-to-noise ratio of the $CH_3$ resonance is better by the factor 6.

The dependence of the signal, which has been edited by an ECZOTIC pulse sequence, on the relaxation time $T_2$ arises only during the two $\frac{1}{2}J$ evolution time intervals, while in the case of methods employing zero-quantum filtering the coherence of interst is subject to $T_2$ relaxation during the entire pulse sequence consisting of at least three $\frac{1}{2}J$ time intervals. The relatively long homospoil time of 170 milliseconds is due to the low gradient field strength of the spectrometer employed for the measurements. All remaining error signals that may result from $T_1$ relaxation may be eliminated by setting an addition/substraction phase cycle with respect to the first selective 90° r.f. pulse 10, in alternation with the amplifier. Generally, it can be said that the short length of the ECZOTIC pulse sequence reduces the dependence of $T_1$ and $T_2$, as compared with a zero-quantum coherence transfer sequence.

An essential feature of correlated z-order spectroscopy is seen in the effect of the phase shift of the pulse 12 for producing a multiple-quantum coherence and of the hard pulse 13 for prducing the z-order. If $n=1$, a phase shift of the $\pi/2$ (y, $\omega I$) pulse inverts the sign of the multiple-quantum coherence, thus providing a mechanism for an addition/substraction cycle for eliminating any remaining error signals.

Figure 4A:
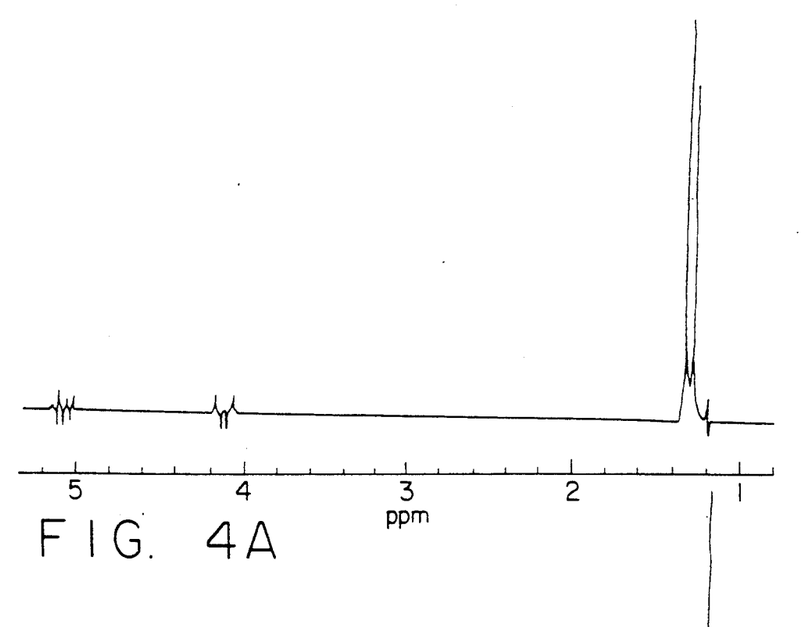
FIG. 4A shows a spectrum obtained with the aid of an ECZOTIC pulse sequence for lactate, with phase alternation of the 90° pulse for the formation of a multiple-quantum coherence.
Figure 4B:
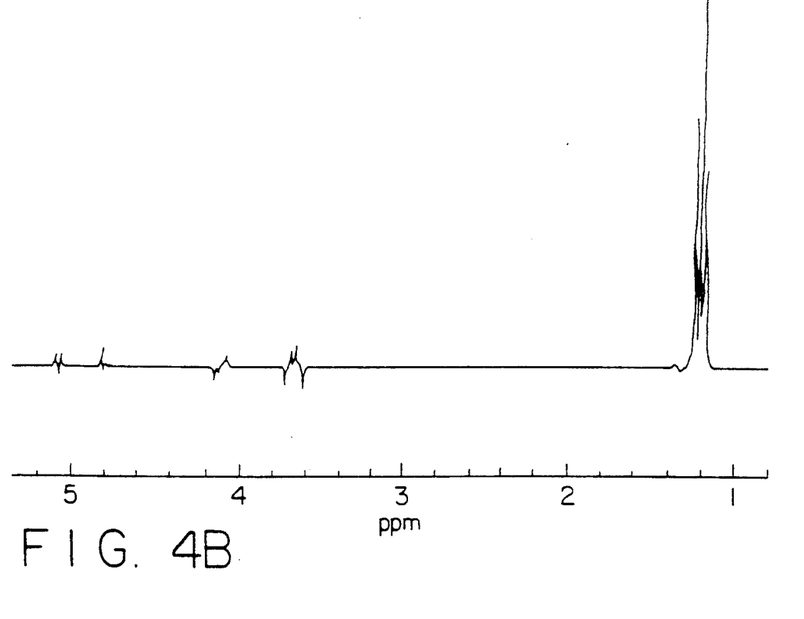
FIG. 4B shows a spectrum, similar to that shown in FIG. 4A, but for ethanol, with phase alternation of the initial 90° pulse.

FIG. 4A shows a double-acquisition spectrum of lactate, with phase shifting of the 90°−($\omega_I$, y) pulse for producing the multiple-quantum coherence; FIG. 4B shows a double acquisition spectrum of ethanol, with phase shifting of the initial 90°−($\omega_S$, x) pulse in coordination with the receiver.

FIG. 4A illustrates the result of such a double-acquisition phase cycle for lactate. However, as will be appreciated when considering the above analysis of the product operators, the phase reversal of the next following 90° r.f. pulse 12 with y phase will not change the phase of the correlated z-order, as the pulse 12 reverses the signs of both $I_x$ and $S_x$. The opposite is true when $n=2$, because then the reversal of the selective r.f. pulse 12 for production of the multiple-quantum coherence does not reverse the sign of the multiple-quantum coherence, being applied to a $I_y^2$ component. Now, phase shifting of the hard 90° r.f. pulse 12 with x phase, by alternation with the receiver, is feasible. An even more efficient elimination of any remaining lactate signals would then be possible by phase reversal of the first selective 90° r.f. pulse 10 of the frequency $\omega_S$ and of x phase, as illustrated by the spectrum of FIG. 4B.

Figure 5:
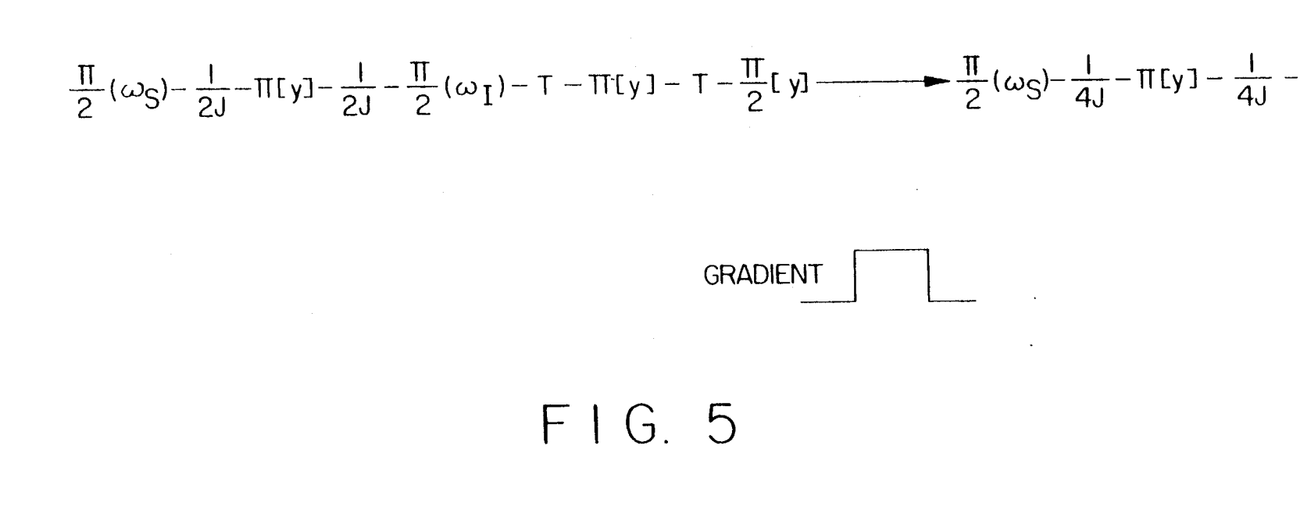
FIG. 5 shows a representation, similar to that of FIG. 1, illustrating a pulse sequence different from that of FIG. 1.

According to a further improvement of the invention, the pulse sequence of FIG. 1 may be supplemented by adding 180° pulses, as indicated in FIG. 5. The improved signal-to-noise ratio that can be obtained with the aid of the method according to the present invention suggests itself for application not only in editing studies of high-resolution spectra of aqueous solutions, but also in imaging processes for metabolities, and in volume-selective in-vivo experiments. Generally, one would in this case initially produce the correlated z-order for the metabolite of interest, and the homospoil field gradient 12 according to FIG. 1 could be replaced by a volume selective sequence. The localized metabolite signal would then be observed following the last selective pulse 14.

However, the volume-selective representation of lactate gives rise to a certain difficulty when one phase reversal per disc is required for an addition/subtraction cycle. Generally, the correlated z-order produced according to the method of the invention is described by the term $I_z^n S_z$. If $n=1$, as in the case of lactate, then the sign of the correlated z-order cannot be reversed by a hard 180° r.f. pulse, or by a selective 180° r.f. pulse in the presence of a disc gradient, and this for the same reasons that have been explained above. Therefore, one either requires a method for alternate disc reversal, or a volume selection step must be carried out prior to the spectral editing step. If $n=2$, the correlated z-order is always odd and can be reversed in the usual manner.

The spectra illustrated in FIGS. 2 to 4 were recorded on a 200 MHz spectrometer with an magnet system of 4.7 T. The magnet system had a useful diameter of 13 centimeters, and was equipped with a deuterium field frequency lock. The selective excitation was obtained using an 90° r.f. pulse of low power, a length of 20 ms and a Gaussian pulse shape (f(x)=exp(−ax²), a=3.0, clipped at 1%). The length of the hard pulse was typically 20 μs. The spectra were recorded on samples in non-rotating 10 mm NMR tubes containing 10% $D^2O$. In the case of those spectra for which two measurements were carried out in succession, the repetition rate was 25 s. The homospoil gradient was generated by pulsation of the room temperature shim (z), which produced a maximum gradient of 2.7 mT/m.

The present invention further permits to carry out volume-selective measurements. To this end, one sets at least one of the r.f. pulses 11, 13 or 17 to be disc-selective, and applies simultaneously a magnetic gradient field pulse. In addition, imaging processes can also be carried out, as known as such. For example, one of the r.f. pulses 11 or 13 can be adjusted to be disc-selective, and a phase gradient can be introduced during the time interval between the fourth r.f. pulse 14 and the signal recording step. One then either records the signal 16 under a read gradient, or introduces a second phase gradient during the time interval following the fourth r.f. pulse 14, in order to obtain chemical shift imaging.

The described embodiments relate to lactate where the protons of the two groups $CH^3$ and CH, respectively, are coupled (homonuclear coupling). It is, however, understood that the invention also relates to such cases where different kinds of nuclei are coupled (heteronuclear coupling). In this latter case, each of the "hard" or disc-selective r.f. pulses 11, 13, 17 must be replaced by a pair of isochronic pulses of correct phase, each acting on one of the two kinds of nuclei.

I claim:

1. A method of recording spin resonance spectra of test samples having at least a first and a second group ($CH_3$, CH) of nuclei of the same kind and of substantially identical chemical shift, and for suppressing signals of said second group (CH) for the purpose of obtaining an isolated signal of said first group ($CH_3$), the method comprising the steps of:
   a) irradiating a pulse sequence of a first, a second, a third and a fourth r.f. pulse, preferably 90° r.f. pulses, upon the sample, wherein
      i) said first r.f. pulse is a soft pulse being selective for the nuclei of said first group ($CH_3$);
      ii) said second r.f. pulse is a soft pulse being selective for the nuclei of said second group (CH), said second r.f. pulse being adjusted in such a way that the magnetizations of the nuclei of said first group ($CH_3$) and of said second group (CH) are at least partially transferred to a state of multiple-quantum coherence;
      iii) immediately following said second r.f. pulse, said third r.f. pulse, being at least one hard pulse, is irradiated upon said sample, and is adjusted in such a way that said multiple-quantum coherence is transferred to a correlated z-order state;
      iv) a dephasing magnetic gradient field pulse is exerted upon said sample in an interval $\tau$HS between said third r.f. pulse and said fourth r.f. pulse, and
      v) said fourth r.f. pulse is a soft pulse being selective for the nuclei of said first group ($CH_3$), said fourth r.f. pulse being adjusted in such a way that said multiple-quantum coherence is re-transferred to a state of single-quantum coherence of the nuclei of said first group ($CH_3$); and
   b) thereafter detecting resonance signals of the nuclei of said first group ($CH_3$).

2. The method of claim 1, wherein said sample is a lactate sample or an ethanol sample.

3. The method of claim 1, wherein said first r.f. pulse is in x-phase, said second r.f. pulse is in y-phase, and said third r.f. pulse is in y-phase, and said fourth r.f. pulse is again in x-phase.

4. The method of claim 1, wherein a first 180° r.f. pulse is irradiated upon said sample, at the middle of a time interval between said first and said second r.f. pulses.

5. The method of claim 1, wherein a second 180° r.f. pulse is irradiated upon said sample following said fourth r.f. pulse.

6. The method of claim 1, wherein said sample is exposed, for volume-selective measurements, to a sequence of magnetic gradient field pulses of different coordinate directions (x, y, z), with at least one of said r.f. pulses of said pulse sequence being adjusted to be slice-selective.

7. The method of claim 1, wherein a time interval between said first r.f. pulse and said second r.f. pulse is selected to be equal to an odd multiple of the reciprocal value of twice the coupling constant (J) between said first group ($CH_3$) and said second group (CH).

8. The method of claim 6, wherein said volume-selective measurements are processed for imaging purposes.

9. A method of recording spin resonance spectra of test samples having at least a first and a second group ($CH_3$, CH) of nuclei of the same kind and of substantially identical chemical shift, and for suppressing signals of said second group (CH) for the purpose of obtaining an isolated signal of said first group ($CH_3$), the method comprising the steps of:
   a) irradiating a pulse sequence of a first, a second, a third and a fourth r.f. pulse, preferably 90° r.f. pulses, upon the sample, wherein
      i) said first r.f. pulse is a soft pulse being selective for the nuclei of said first group ($CH_3$);
      ii) said second r.f. pulse is a soft pulse being selective for the nuclei of said second group (CH), said second r.f. pulse being adjusted in such a way that the magnetizations of the nuclei of said first group ($CH_3$) and of said second group (CH) are at least partially transferred to a state of multiple-quantum coherence;
      iii) immediately following said second r.f. pulse, said third r.f. pulse, being at least one hard pulse, is irradiated upon said sample, and is adjusted in such a way that said multiple-quantum coherence is transferred to a correlated z-order state;
      iv) a dephasing magnetic gradient field pulse is exerted upon said sample in an interval $\tau$HS between said third r.f. pulse and said fourth r.f. pulse, and
      v) said fourth r.f. pulse is a soft pulse being selective for the nuclei of said second group (CH), said fourth r.f. pulse being adjusted in such a way that said correlated z-order state is transferred by polarization transfer from the nuclei of said first group ($CH_3$) to a state of single-quantum coherence of the nuclei of said second group (CH); and
   b) thereafter detecting resonance signals of the nuclei of said first group ($CH_3$).

10. The method of claim 9, wherein said sample is a lactate sample or an ethanol sample.

11. The method of claim 9, wherein said first r.f. pulse is in x-phase, said second r.f. pulse is in y-phase, said third r.f. pulse is in y-phase, and said fourth r.f. pulse is again in x-phase.

12. The method of claim 9, wherein a first 180° r.f. pulse is irradiated upon said sample, at the middle of a time interval between said first and said second r.f. pulses.

13. The method of claim 9, wherein a second 180° r.f. pulse is irradiated upon said sample following said fourth r.f. pulse.

14. The method of claim 9, wherein said sample is exposed, for volume-selective measurements, to a sequence of magnetic gradient field pulses of different coordinate directions (x, y, z), with at least one of said r.f. pulses of said pulse sequence being adjusted to be slice-selective.

15. The method of claim 9, wherein a time interval between said first r.f. pulse and said second r.f. pulse is selected to be equal to an odd multiple of the reciprocal value of twice the coupling constant (J) between said first group ($CH_3$) and said second group (CH).

16. The method of claim 6, wherein said volume-selective measurements are processed for imaging purposes.

* * * * *